US 6,707,712 B2

(12) United States Patent
Lowery (10) Patent No.: US 6,707,712 B2
(45) Date of Patent: Mar. 16, 2004

(54) METHOD FOR READING A STRUCTURAL PHASE-CHANGE MEMORY

(75) Inventor: Tyler A. Lowery, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/458,828

(22) Filed: Jun. 10, 2003

(65) Prior Publication Data

US 2003/0198118 A1 Oct. 23, 2003

Related U.S. Application Data (63) Continuation of application No. 09/921,853, filed on Aug. 2, 2001, now Pat. No. 6,590,807.

(51) Int. Cl.[7] .............................................. G11C 11/36
(52) U.S. Cl. ...................... 365/175; 365/203; 365/163; 365/100
(58) Field of Search ................................. 365/175, 203, 365/163, 174, 100, 148, 113, 105, 115

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 5,296,716 A | 3/1994 | Ovshinsky et al. | |
| 5,789,758 A | 8/1998 | Reinberg | |
| 5,879,955 A | 3/1999 | Gonzalez et al. | |
| 5,920,788 A | 7/1999 | Reinberg | |
| 5,933,365 A | 8/1999 | Klersy et al. | |
| 5,970,336 A | 10/1999 | Wolstenholme et al. | |
| 5,998,244 A | 12/1999 | Wolstenholme et al. | |
| 6,002,140 A | 12/1999 | Gonzalez et al. | |
| 6,031,287 A | 2/2000 | Harshfield | |
| 6,085,341 A | 7/2000 | Greason et al. | |
| 6,087,674 A | 7/2000 | Ovshinsky et al. | |
| 6,141,241 A | 10/2000 | Ovshinsky et al. | |
| 6,153,890 A | 11/2000 | Wolstenholme et al. | |
| 6,229,157 B1 | 5/2001 | Sanhu | |
| 6,480,438 B1 * | 11/2002 | Park | 365/230.06 |
| 6,567,293 B1 * | 5/2003 | Lowrey et al. | 365/100 |
| 6,570,784 B2 * | 5/2003 | Lowrey | 365/163 |
| 6,625,054 B2 * | 9/2003 | Lowrey et al. | 365/148 |

OTHER PUBLICATIONS

U.S. patent application, pending, Xu et al., 09/895,599, filed Jun. 29, 2001.
U.S. patent application, pending, Xu et al., 10/034331, filed Dec. 28, 2001.

* cited by examiner

*Primary Examiner*—Anh Phung
(74) *Attorney, Agent, or Firm*—Anthony M. Martinez (57) ABSTRACT

A cell in a structural phase-change memory is programmed by raising cell voltage and cell current to programming threshold levels, and then lowering these to quiescent levels below their programming levels. A precharge pulse is then applied which raises the bitline voltage of the selected cell and does not raise the cell voltage and cell current to their programming levels. Then, the cell current is raised to a read level which is below the programming threshold level, and the bitline voltage is compared to a reference voltage while the cell current is at the read level.

26 Claims, 6 Drawing Sheets

METHOD FOR READING A STRUCTURAL PHASE-CHANGE MEMORY

This is a continuation of application Ser. No. 09/921,853, filed Aug. 2, 2001, now U.S. Pat. No. 6,590,807 issued on Jul. 8, 2003.

BACKGROUND

This invention is related to read operations that are applied to read a phase-change material solid state memory device.

Solid state memory devices that use a structural phase-change material as the data storage mechanism (referred to here simply as 'phase-change memories') offer significant advantages in both cost and performance over conventional charge storage based memories. The phase-change memory is made of an array of constituent cells where each cell has some structural phase-change material to store the cell's data. This material may be, for instance, a chalcogenide alloy that exhibits a reversible structural phase change from amorphous to crystalline. A small volume of the chalcogenide alloy is integrated into a circuit that allows the cell to act as a fast switching programmable resistor. This programmable resistor can exhibit greater than 40 times dynamic range of resistivity between a relatively crystalline phase (low resistivity) and a relatively amorphous phase (high resistivity). The data stored in the cell is read by measuring the cell's resistance. The chalcogenide alloy cell is also non-volatile.

The phase-change memory cell can be programmed, i.e. written to, and read by applying current pulses that have the appropriate magnitude and duration and that cause the needed voltages across and current through the volume of phase-change material in the cell. A selected cell in a structural phase-change memory may be programmed into a selected state by raising a cell voltage and a cell current for the selected cell to programming threshold levels that are characteristic of the phase-change material in the cell. The voltage and current are then typically lowered to quiescent levels (e.g. essentially zero voltage and current) which are below their programming threshold levels. This process may be performed by the application of, for example, a reset pulse and a set pulse which can program the cell into two different logic states. In both of these pulses, the cell voltage and cell current are caused to rise at least as high as certain threshold voltage and current levels needed to program the cell. Next, to read the programmed cell, a read pulse may be applied to measure the relative resistance of the cell material, without changing its phase. Thus, the read pulse typically provides a much smaller magnitude of cell current and cell voltage than either the reset pulse or the set pulse.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION

The inventor has discovered that in relatively large phase-change memory arrays, the read operation as described above may be made faster by applying a precharge pulse which raises a bitline voltage of the selected cell without raising the cell voltage and the cell current to their programming threshold levels, prior to raising the cell current to its read level. The bitline voltage that is used to obtain a measure of the cell voltage (and hence the relative resistance of the material in the cell) becomes available sooner in time when using the precharge pulse. This appears to be because the bitline, which, depending upon how large the memory array is, can exhibit capacitance that is quite large in relation to the read current, has been charged by a relatively short duration precharge pulse to a sufficiently high voltage level that allows the bitline voltage to subsequently develop a measure of the cell voltage very quickly despite the relatively small read current.

A further advantage of using the precharge pulse appears in certain embodiments where the cell current is controlled independently of the precharge pulse. This allows the read operation to be successful in view of variations in the structure and electrical behavior of the cells in the array, by selecting the proper margin of error in the read current level.

Figure 1:
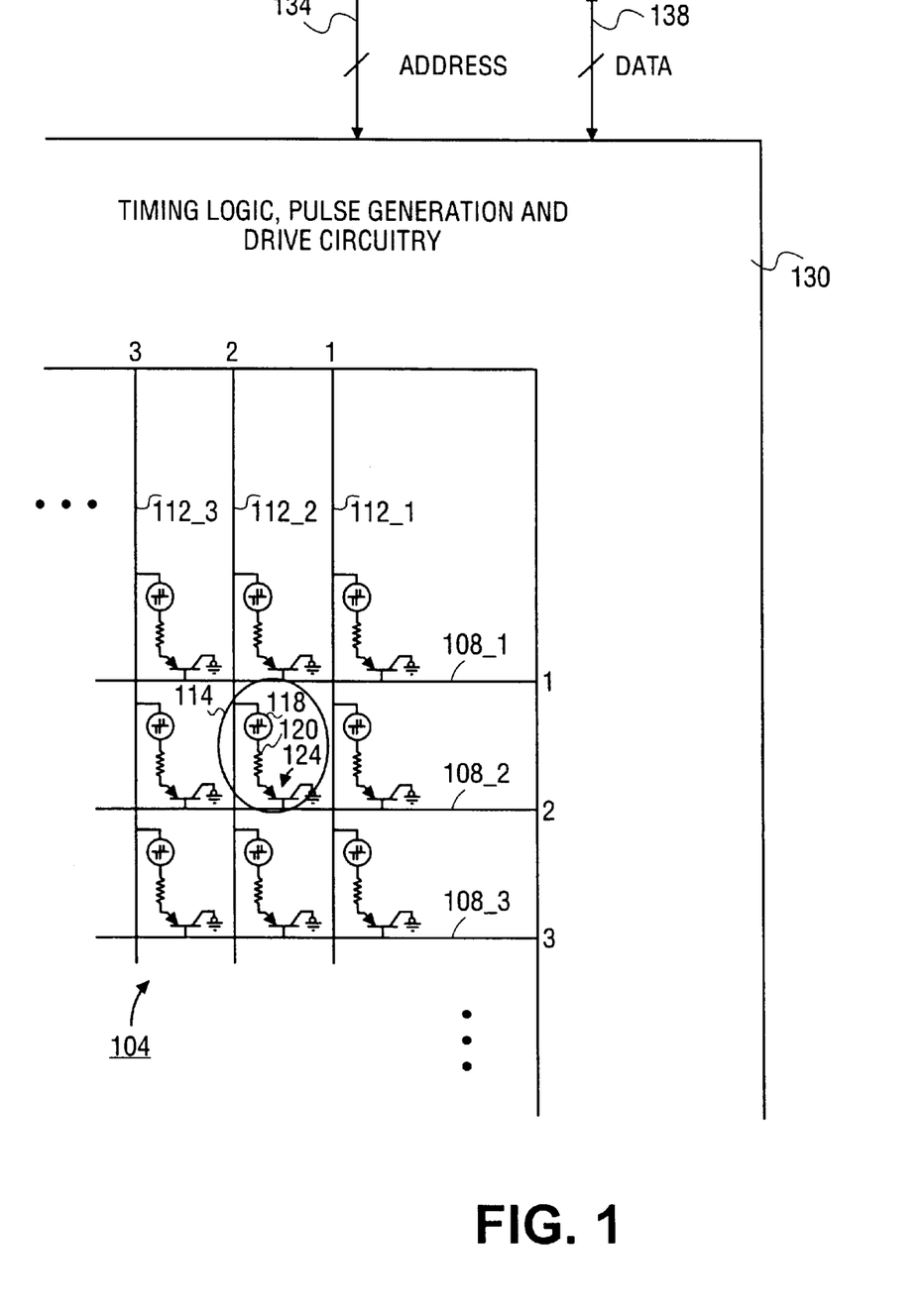
FIG. 1 shows a block diagram of part of an integrated circuit that features a phase-change memory array that is coupled to be controlled according to an embodiment of the invention.

Referring now to FIG. 1, what is shown is a block diagram of part of an integrated circuit (IC) that features a phase-change memory array 104 that is coupled to be controlled by timing logic, pulse generation and drive circuitry 130. The circuit 130 is capable of performing programming and read operations on the array 104 according to the various embodiments described. Beginning first with the array 104, a number of vertically oriented conductive lines 112_1, 112_2, ..., sometimes called bitlines, and a number of horizontally oriented conductive lines 108_1, 108_2, ..., sometimes called wordlines, may be built on a semiconductor IC die in a cross-point matrix arrangement as shown. Each crossing of a bitline-wordline pair is associated with a separate memory cell 114. To achieve low manufacturing costs in large volumes, every memory cell 114 in the array 104 may be designed to have the same structure.

Each memory cell 114 has a volume of structural phase-change material 118 that is coupled between a separate bitline-wordline pair of the bitlines 112 and wordlines 108. The volume of phase-change material 118 serves to store information for that cell according to its programmed resistivity. Access to each cell 114 in the embodiment of FIG. 1 is via its corresponding bitline-wordline pair and is made possible through additional circuitry in each cell, namely an isolation device such as a parasitic PNP bipolar transistor 124. The wordline for the selected cell, in this case wordline 108_2, is connected to the base of the transistor 124 while the bitline 112_2 for the cell 114 is connected to another side of the volume of phase-change material 118. In this embodiment, the volume of phase-change material 118 is in series with the emitter of the transistor 124, while the collector of the transistor 124 is connected to a power return node that may be common to all memory cells in the array 104 as well as the timing logic, pulse generation and drive circuitry 130 of the IC. The transistor 124 connected as shown in FIG. 1 acts as a solid state switch under the control of a wordline signal received at its base. Other configurations for selectively blocking the cell current through the phase-change material 118, such as using a discrete switching field effect transistor, are also possible. A resistor 120 may also be provided for heating and/or current limiting purposes in series with the volume of phase-change material 118.

The cell current may be defined as a current through the volume of phase-change material 118, and, in this embodiment, is also the bitline current. The cell current, in this embodiment, is equal to the emitter current of the transistor 124. The cell voltage, on the other hand, may be more loosely defined as any voltage relating to the cell 114 that includes the voltage across the volume of phase-change material 118.

Still referring to FIG. 1, the timing logic, pulse generation and drive circuitry 130 has a number of input and output ports where each is coupled to a respective bitline 112 and wordline 108 of the array 104. These ports are driven with appropriate signal levels and timing so that one or more selected cells may be programmed and read as will be seen below. Conventional drive circuitry such as switching transistors may be used together with pulse generation circuitry that allows any desired waveshaping to be achieved on the signals that are driven into the bitlines and wordlines. The timing logic may also be implemented using conventional components including, for instance, counters to impart the needed timing for greater accuracy and speed in the programming and read operations. The timing logic may respond to input requests received via address lines 134 and data lines 138. Such requests may be to, for instance, write a single-bit or multi-bit data value to one or more cells in the array 104. Thus, the circuitry 130 is understood to include any necessary decoding logic to translate the address and data information received on the address and data lines into those bitline-wordline pairs of the array 104 that are to be driven and that correspond to the requested data and address. The circuitry 130 may be formed on the same IC die as the array 104.

It should be noted that although the description herein refers to a single selected or target memory cell being programmed and read, the concepts are also applicable to simultaneously program and read from a number of memory cells simultaneously. For instance, depending upon the write request received by the circuitry 130, a number of memory cells that are in the same row of the array and are thus coupled to the same wordline 108, where each of these cells is coupled to a different bitline 112, may be programmed or read simultaneously.

When a cell 114 has been selected to be either programmed or read, the appropriate pulse is applied to the wordline-bitline pair of the selected cell. Thus, when the cell 114 shown in FIG. 1 is selected to be programmed or read, the potential on the bitline 112_2 is raised above that of the power return node while the potential on the wordline 108_2 is lowered (e.g. to that of the power return node) to provide base drive to the transistor 124. This, in turn, allows the emitter current to increase to the levels permitted by the pulse. The voltage and current levels that may be applied to the selected cell for programming and reading will depend on the current-voltage (i.e., I-V) characteristics of the cell.

Figure 2:
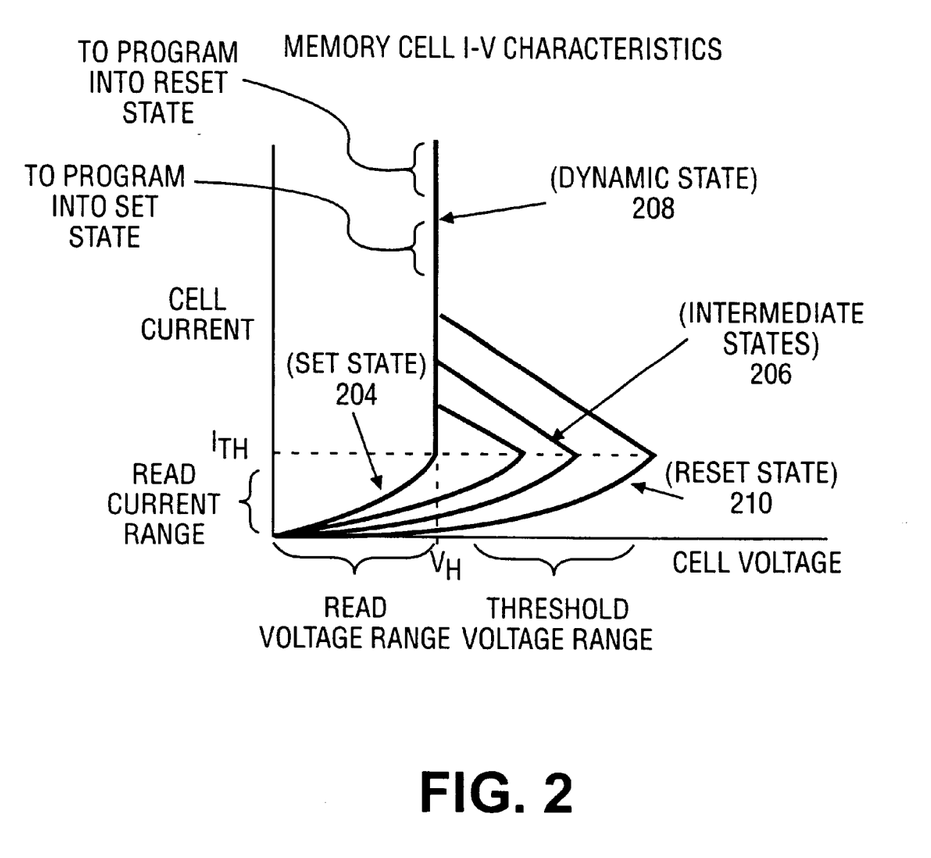
FIG. 2 shows the current voltage characteristics of an exemplary phase-change memory cell.

FIG. 2 shows an exemplary set of memory cell I-V characteristics. The figure has been annotated to show various voltage and current levels that may be involved during programming and reading of a phase-change memory cell. The change in cell current is shown as a function of cell voltage, for different memory cell states. Note for instance the difference between trace 204 and trace 210. The trace 204 corresponds to the I-V characteristics of a cell that is in the set state. In this state, the phase-change material of the cell is predominantly crystalline and therefore presents a low resistance to current. In contrast, when the cell is in the reset state, the phase-change material is predominantly amorphous and therefore presents a relatively high resistance to current. The behavior of the cell in the reset state is given by the trace 210. In an embodiment, the cell may be placed into intermediate states such as those that correspond to traces 206 where the phase-change material has a structure that is neither predominantly crystalline or predominantly amorphous.

As the cell current rises above a threshold $I_{th}$ the material in the cell may undergo a phase change. The threshold current and voltage ranges described and shown in FIG. 2 are examples of what are referred to here as programming threshold levels. Note however that to actually program the cell into a given state, the cell current should be further increased to levels that are indicated in the figure along an essentially vertical trace 208. The trace 208 depicts the dynamic behavior of the cell in which its state may be programmed into the set state, the reset state, or an intermediate state, depending upon the level of cell current reached and the shape and duration of the cell current pulse.

According to an embodiment, the read current range may be between zero and $I_{th}$. Since it may be desirable to read a cell without changing its state, the read level should not be taken above $I_{th}$.

Figure 3:
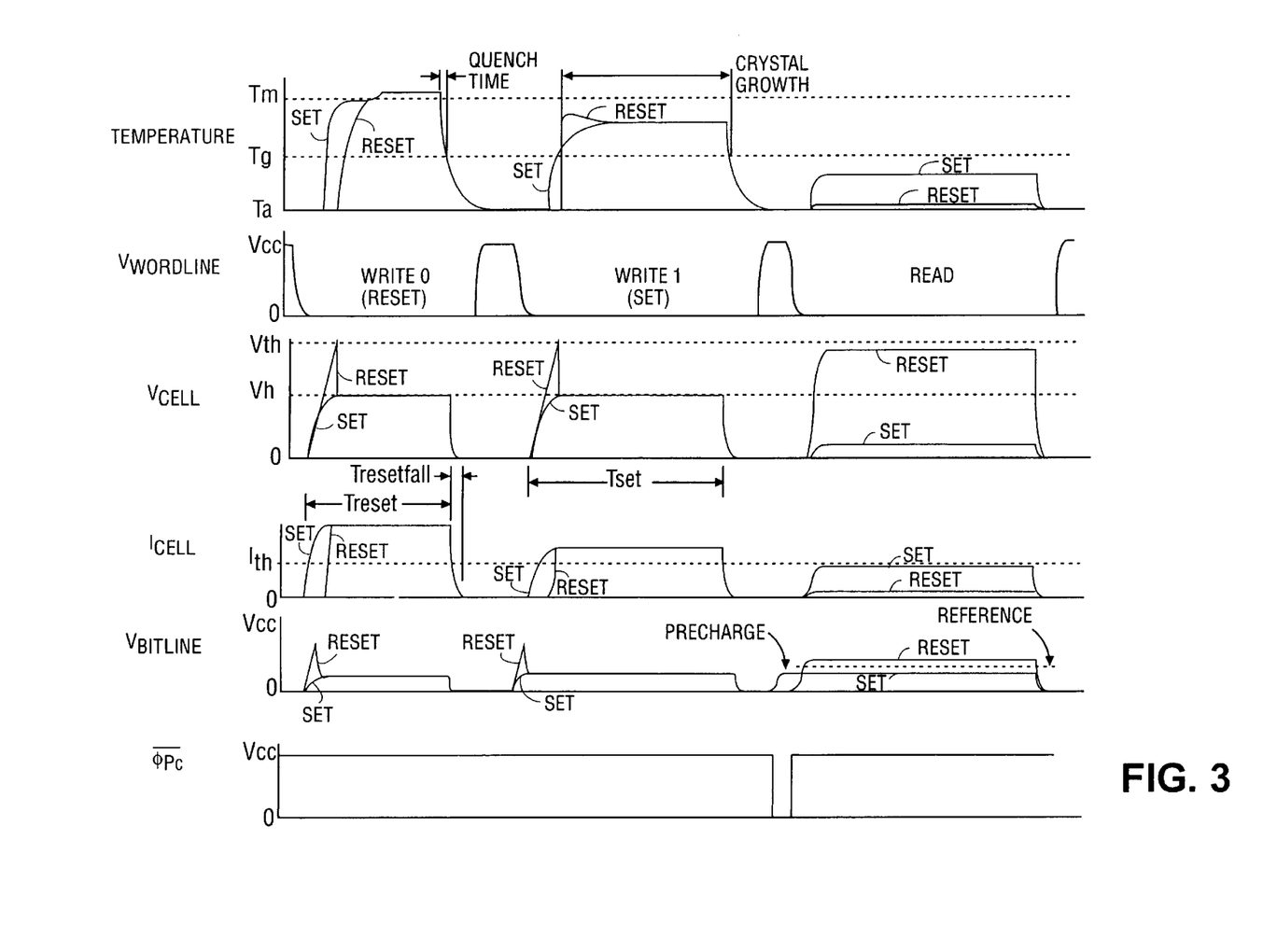
FIG. 3 depicts an exemplary timing diagram for various signals associated with a cell being programmed and read according to an embodiment of the invention.

Turning now to FIG. 3, a set of exemplary timing diagrams that represent various waveforms associated with programming and reading a phase-change memory cell are illustrated. Six sets of waveforms are illustrated, where these represent phase-change material temperature, cell voltage, cell current, wordline voltage, bitline voltage, and the precharge (i.e. PC) control signal. The precharge control signal may be used, according to the various embodiments described here, to apply a precharge pulse that raises a bitline voltage of a selected cell (without raising the cell voltage and cell current to their programming threshold levels) prior to raising the cell current to its readout level.

FIG. 3 may be viewed as containing three columns, where the first column describes a reset operation being performed on a cell, the second column describes a set operation, and the third column describes an embodiment of the read operation. The reset and set operations may be entirely conventional and will be only described briefly here. Note that between programming or other operations, any unselected wordlines are, in this embodiment, raised to a relatively high voltage, e.g. $V_{cc}$, while the unselected bitlines are kept at a relatively low voltage, e.g. zero volts or ground. Thus, referring back to FIG. 1, this means that with the unselected wordlines at $V_{cc}$ and the unselected bitlines at ground, the transistor 124 is assured to be in its cutoff mode thereby assuring that the cell current is minimal.

To reset a cell, the temperature of the phase-change material is to reach a certain level and maintain that level for a given period of time. Thus, in the embodiment shown in FIG. 3, the cell is reset by applying a voltage pulse between the bitline and wordline of the cell such that the cell current rises to a given level and stays there for a given time interval $T_{reset}$. The two waveforms shown and marked SET and RESET refer to the behavior of the current or voltage (as the case may be) if the cell were in the set or reset state, respectively. Thus, referring to the first column (Write 0 or reset operation), if the cell being written to is already in the reset state, then the current and voltages behave as indicated by the RESET nomenclature. On the other hand, if the cell being programmed is currently in the set state, then the voltage and current behavior is given by the waveforms that are labeled SET. To finish programming the cell into the reset state, the temperature of the phase-change material in the cell is rapidly lowered as defined by a quench time shown in the figure. This quench time may be obtained by rapidly reducing the cell current within an interval $T_{reset\,fall}$ also as shown. Thereafter, the cell voltage and currents are brought down to their quiescent levels which, in this embodiment, is essentially zero volts and amperes. The zero voltage and current for the quiescent levels help reduce power consumption as well as maintain the programmed state of the cell.

Still referring to FIG. 3, the second column depicts the waveforms generated during an exemplary write operation in which the cell is programmed into its set state. If the cell were currently in the reset state and a set operation were to be performed, the waveforms that are labeled RESET in the second column are the ones that will be exhibited by the memory cell. To set the cell, the temperature of the phase-change material is maintained for a crystal growth interval that is met by a time interval $T_{set}$ of the set pulse. Once again, after the cell has been programmed, the cell is unselected by raising its wordline voltage up to $V_{cc}$ and lowering its bitline voltage to ground.

Referring now to the third column of FIG. 3, an embodiment of a read operation that includes a precharge pulse is depicted. The application of the precharge pulse is evidenced by the active low pulse in the precharge control signal that is depicted by the waveform at the bottom of FIG. 3. In the embodiment shown, the precharge pulse is initiated while the bitline-wordline pair are at their quiescent levels, that is, unselected. A particular circuit implementation for implementing the precharge pulse will be illustrated and described below in connection with FIG. 4. For now, it is sufficient to understand that the precharge pulse serves to raise the bitline voltage of the selected cell as shown in the bitline voltage waveform of FIG. 3, without raising the cell voltage and cell current to their programming threshold levels.

In the embodiment shown in FIG. 3, the change in cell voltage and cell current during the precharge pulse is considered to be quite small with respect to the increase in the bitline voltage. This is due to the pre-charge voltage being dropped predominantly across the isolation device, particularly across the emitter base terminals of the transistor 124 (see FIG. 1).

According to an embodiment, the end of the precharge pulse may be loosely defined as the point in time after which the bitline voltage has reached a predefined level above the quiescent level. Various levels of precharge voltage may be used, so long as they help reduce the period of time needed for subsequently obtaining the bitline voltage that represents a measurement of the cell data state for read purposes. For example, the peak level of the precharge pulse voltage on the bitline may be in the range of 0.5 volts to 1.5 volts for a memory cell having a typical phase-change material such as $Ge_2\,Sb_2\,Te_5$.

The precharge pulse is immediately followed by raising the cell current to a read level, which is below the programming threshold level, and comparing the bitline voltage obtained while the current is at the read level to a reference voltage. Depending upon the state of the memory cell being read, the cell voltage will be different: if the cell is in the reset state wherein the phase-change material has relatively high resistance, then the bitline voltage obtained while the current is at the read level is greater than would be the case if the cell were in the set state. This can be seen in the waveform for $V_{bitline}$ in FIG. 3. In addition, due to the different resistances provided by the phase-change material in the set and reset states, the read level of the cell current may also be different as shown in the FIG. if the read current is not supplied by a constant current source. Alternatively, a constant current source may be used to provide a fixed read current level for both set and reset conditions.

An exemplary magnitude of the current pulse for setting the memory cell may be 50 microAmperes to 650 microAmperes for a memory cell having a typical phase-change material such as $Ge_2\,Sb_2\,Te_5$. In contrast, the magnitude of the reset current pulse as described above for the same cell would be in the range of 100 microAmperes to 3 milliAmperes. A suitable read level for the current in a typical memory cell could be 5 microAmperes to 100 microAmperes. These levels may be applicable to a phase-change material that presents a low resistance in the range of 1 kiloOhm to 10 kiloOhms and a high resistance range of greater than 100 kiloOhms. The time interval needed for the cell current to be maintained at the read level may be relatively short, such as in the range of 5 to 30 nanoseconds. The precharge pulse may be even shorter in duration. The read time interval also depends on the time needed to develop a sufficiently large voltage differential between a reference voltage and the bitline voltage which will be compared by, for instance, a sense amplifier. An exemplary circuit implementation of the sense amplifier will be given below in connection with FIG. 4. These values of course are technology and device dependent and may also vary with the particular fabrication process.

Figure 4:
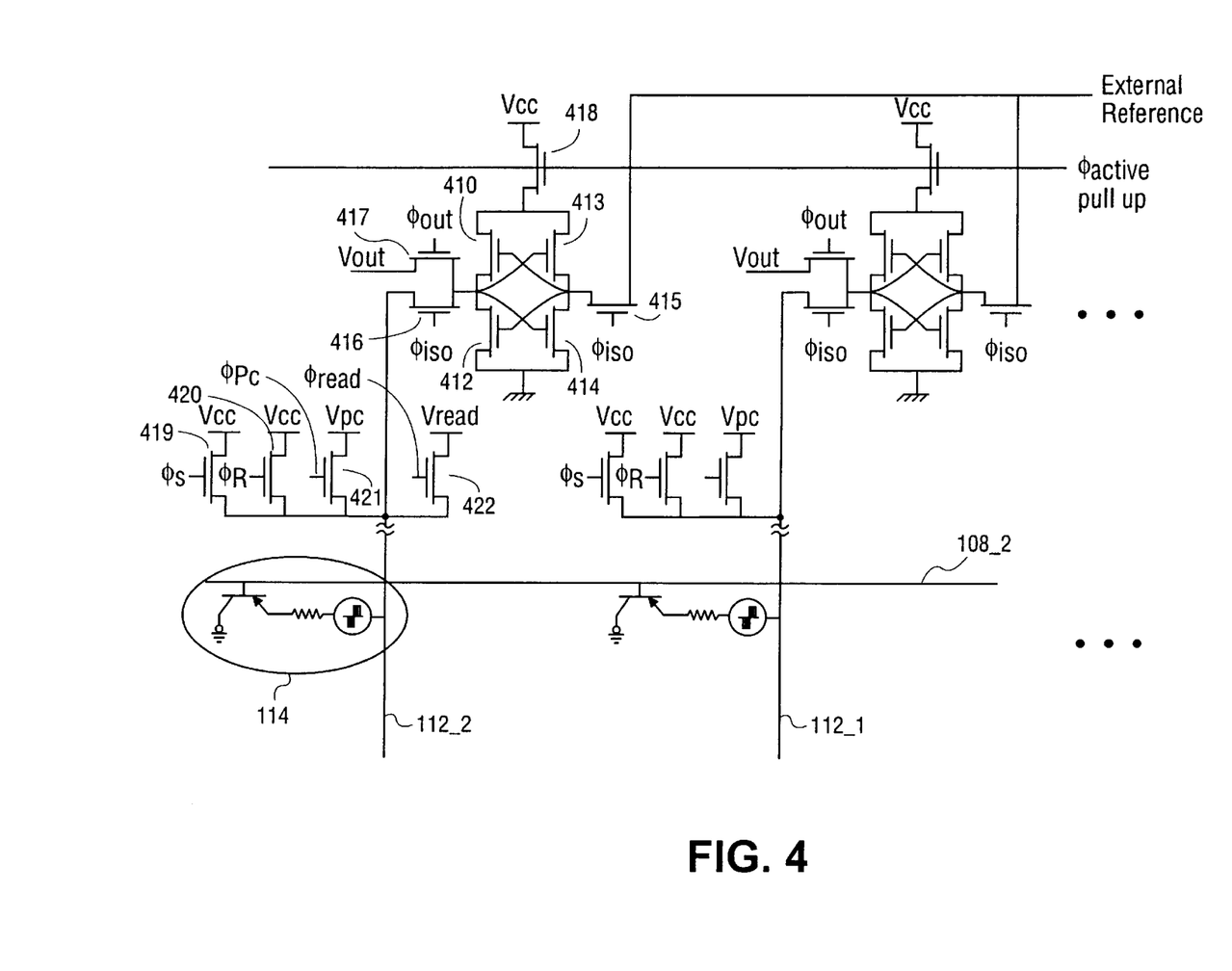
FIG. 4 illustrates a circuit schematic of an embodiment of pulse generation and drive circuitry that is coupled to the bitlines of a phase-change memory array.

Referring now to FIG. 4, what is shown is a circuit schematic of an embodiment of pulse generation and drive circuitry that is coupled to the bitlines 112_1 and 112_2 of a phase-change memory array. This circuit implementation uses entirely metal oxide semiconductor field effect transistors (MOSFETs) although depending upon the fabrication process other types of transistors may alternatively be used. The description below focuses on transistors 410–422 which are coupled to program and read the selected cell 114 via bitline 112_2 and wordline 108_2. The same circuit implementation may be repeated for other bitlines of the array. The timing logic used to control the transistors of the pulse generation and drive circuitry and the control signal or the wordlines are not shown but the design of such circuitry would be readily achievable for those of ordinary skill in the art given the description above in connection with the exemplary timing diagram of FIG. 3 and the following discussion.

It can be seen that the cell 114 is controlled in part by a signal that is applied to the wordline 108_2. Assuming the cell 114 has been selected to be either programmed or read, then the potential on the wordline 108_2 is lowered to a sufficiently low level that allows the PNP transistor inside the selected cell 114 to conduct a cell current. In this embodiment, the cell current is the same as the bitline current that is provided by one of the transistors 419–422. Transistor 419, via a digital SET control signal, is used to generate a set programming current pulse. In the same way, transistor 420 is used to generate a reset programming current pulse, in response to a digital RESET control signal. Similarly, the precharge pulse is generated using transistor 421 under control of a digital PRECHARGE control signal. Finally, the cell current is raised to its read level using the transistor 422 under control of a digital READ control signal. In the embodiment shown, the set, reset, and read current pulses provided to the selected cell 114 are of constant magnitude (i.e. rectangular). Alternatively, the pulses may have non-rectangular shapes provided they still achieve the desired programming or read result.

Sensing the resistance of the phase-change material, which is a goal of the read operation, can be accomplished in the embodiment shown in FIG. 4 using a sense amplifier that is made of transistors 410–418. The sense amplifier provides a measure of the resistance by comparing the voltage on the bitline 112_2 to an external reference voltage. The inputs to the sense amplifier are controlled by isolation transistors 416 for the bitline voltage and 415 for the reference voltage. In this embodiment of the sense amplifier, the output of the sense amplifier is a single ended voltage $V_{out}$ gated by a transistor 417. Transistors 410 and 413 form a cross-coupled p-channel pair, while n-channel transistors 412 and 414 also form a cross-coupled pair. Connected as shown, these pairs of cross-coupled transistors form a regenerative circuit that will be able to resolve the difference between two input signals (here the bitline voltage and the reference voltage) by quickly providing an indication of which is the greater input voltage, with reference to a common power supply return voltage (in this case, ground). To help conserve power, a switching pull up transistor 418 under the control of a digital ACTIVE PULL UP control signal, is provided to in effect shut down the sense amplifier when the voltage on the bitline 112_2 is not being read.

An embodiment of a read process using the pulse generation and drive circuitry shown in FIG. 4 is now described. A read operation begins by selecting one or more cells to be read. In one embodiment, the selected cells may be in the same row. In that case, the voltages on the wordlines that correspond to all deselected rows of memory cells are raised to $V_{cc}$ while the wordline for the selected row is brought to ground. In FIG. 4, the selected row includes the selected cell 114 which is connected to the wordline 108_2. The bitlines 112 for the selected columns to be read are precharged to a voltage $V_{pc}$. In the embodiment of FIG. 4, this is accomplished by turning on transistor 421. During the precharge pulse, that is while the transistor 421 is turned on, isolation transistors 415 and 416 of the sense amplifier may be turned on. Note that the sense amplifier itself is not yet activated at this time (i.e. transistor 418 remains in cutoff). Next, transistor 421 is turned off, thereby ending the precharge pulse, and then transistor 422 is turned on to provide read current into the bitline 112_2. After a time delay that is sufficient to develop a minimum differential between the external reference voltage and the bitline voltage provided to the sense amplifier (where this minimum differential depends on the sensitivity of the sense amplifier), the isolation transistors 415 and 416 are turned off and the sense amplifier is activated (that is by turning on transistor 418). After sufficient amplification by the sense amplifier, a digital value $V_{out}$ that represents one of two states (e.g. set and reset) in the selected cell is then provided by turning on the gate transistor 417. Note that once the isolation transistors 415 and 416 have been turned off, the bitline 112_2 can be brought back down to ground, in preparation for the next read or programming cycle.

Thus, by combining the precharge operation with a current mode read, a more rapid read operation is possible since there is no need to wait for the bitline to be charged from its quiescent level (here, ground) with the relatively small read current provided by the transistor 422. Recall that this read current should be quite small and probably smaller than the threshold current $I_{th}$ to obtain the proper read results and to avoid changing the phase of the structural phase-change material in the selected cell 114. Nevertheless, the read current may be adjusted based on, for instance, the location of the selected cells being read. This allows an adjustable margin for reading the cells that may exhibit variations in their electrical behavior.

Although the above described read procedure is based on the circuit schematic of FIG. 4 which shows the selected cell 114 having an isolation device that is coupled between the phase-change material and a power return node (in this case ground), a similar procedure may be applied to a phase-change memory array in which the isolation transistor in the memory cell is connected to a power supply node, rather than a power return node. In such an embodiment, the cell current through the volume of phase-change material would be sourced from a power supply node and sunk by a number of pulse generation transistors into a power return node (such as ground). This embodiment may be viewed as the complimentary version of the one in FIG. 4. In addition, although the cell voltage in the embodiments shown in FIGS. 1 and 4 is single-ended with respect to a power return node voltage (here, zero volts), an alternative embodiment may include circuitry that allows the cell voltage to be measured between the corresponding bitline-wordline pair of the cell. In such an alternative embodiment, the cell voltage would be considered a differential voltage measured between the corresponding bitline-wordline pair of the selected cell.

Note that in the embodiment of FIG. 4 which shows a sense amplifier having a first input that receives the bitline voltage and a second input that receives an external reference voltage, the cell is expected to store a single bit. However, for cells that can store multiple bits of information, such as for instance by allowing one or more intermediate states between the set and reset states (see FIG. 2), a comparator circuit with multiple reference levels may be needed to determine the state of a multibit cell.

Figure 5:
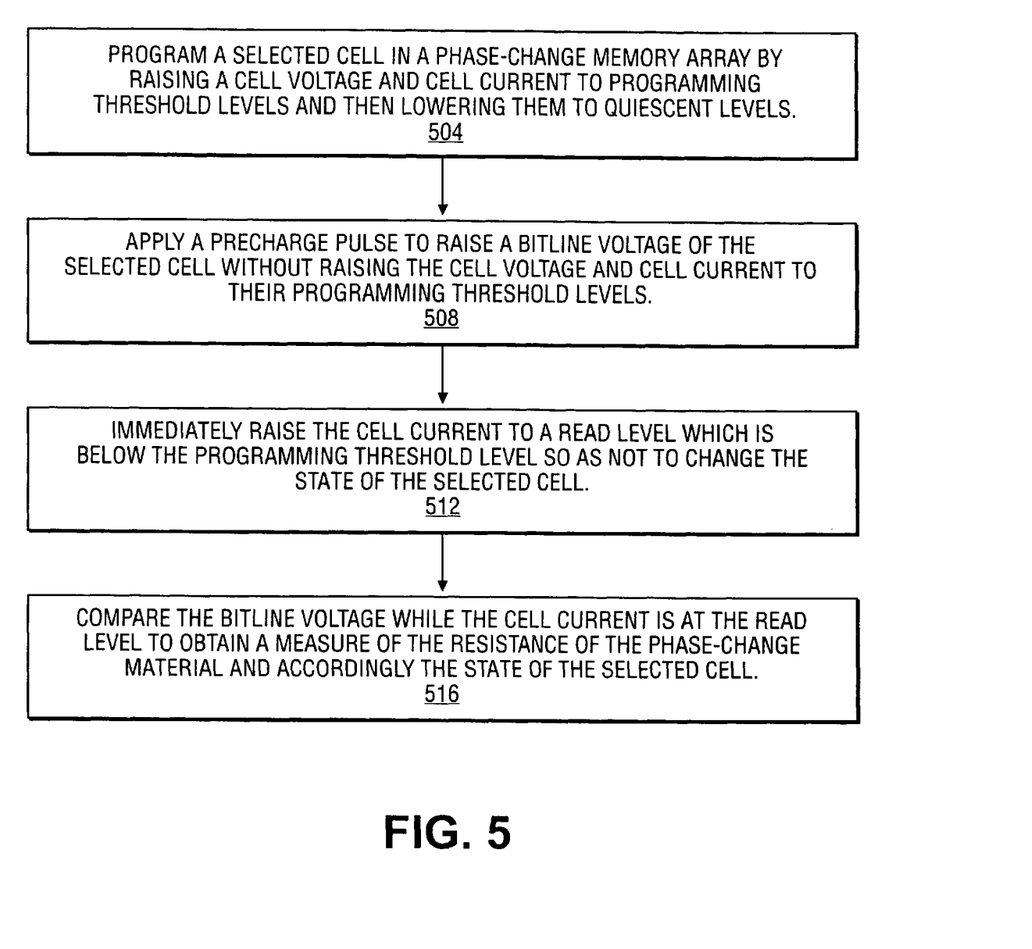
FIG. 5 depicts a flow diagram of an embodiment of a method for operating a structural phase-change memory cell according to an embodiment of the invention.

Turning now to FIG. 5, what is shown is a flow diagram of an embodiment of a method for operating a structural phase-change memory cell. Operation begins with programming a selected cell in the memory into a selected state, by raising a cell voltage and a cell current for the cell to programming threshold levels (operation 504). The voltage and current are then lowered to quiescent levels below their programming threshold levels. The levels may be as described above in connection with FIG. 2 that shows exemplary memory cell I-V characteristics. Operation then proceeds with the application of a precharge pulse (operation 508). This pulse raises a bitline voltage of the selected cell but does not raise the cell voltage and cell current to their programming threshold levels. Thus, the precharge pulse is a relatively short current pulse that may be viewed as serving to charge the selected bitline up towards a level that is expected to be seen when a read current is subsequently passed through the bitline.

Following the application of the precharge pulse, the cell current may be immediately raised to the read level, where the read level is below the programming threshold level so as not to change the state of the selected cell (operation 512). Next, the bitline voltage may be compared to a reference voltage, while the cell current is at the read level, to determine the state of the selected cell (operation 516). The use of the precharge pulse prior to raising the cell current to read levels may also be applicable to the multibit cell embodiment.

Figure 6:
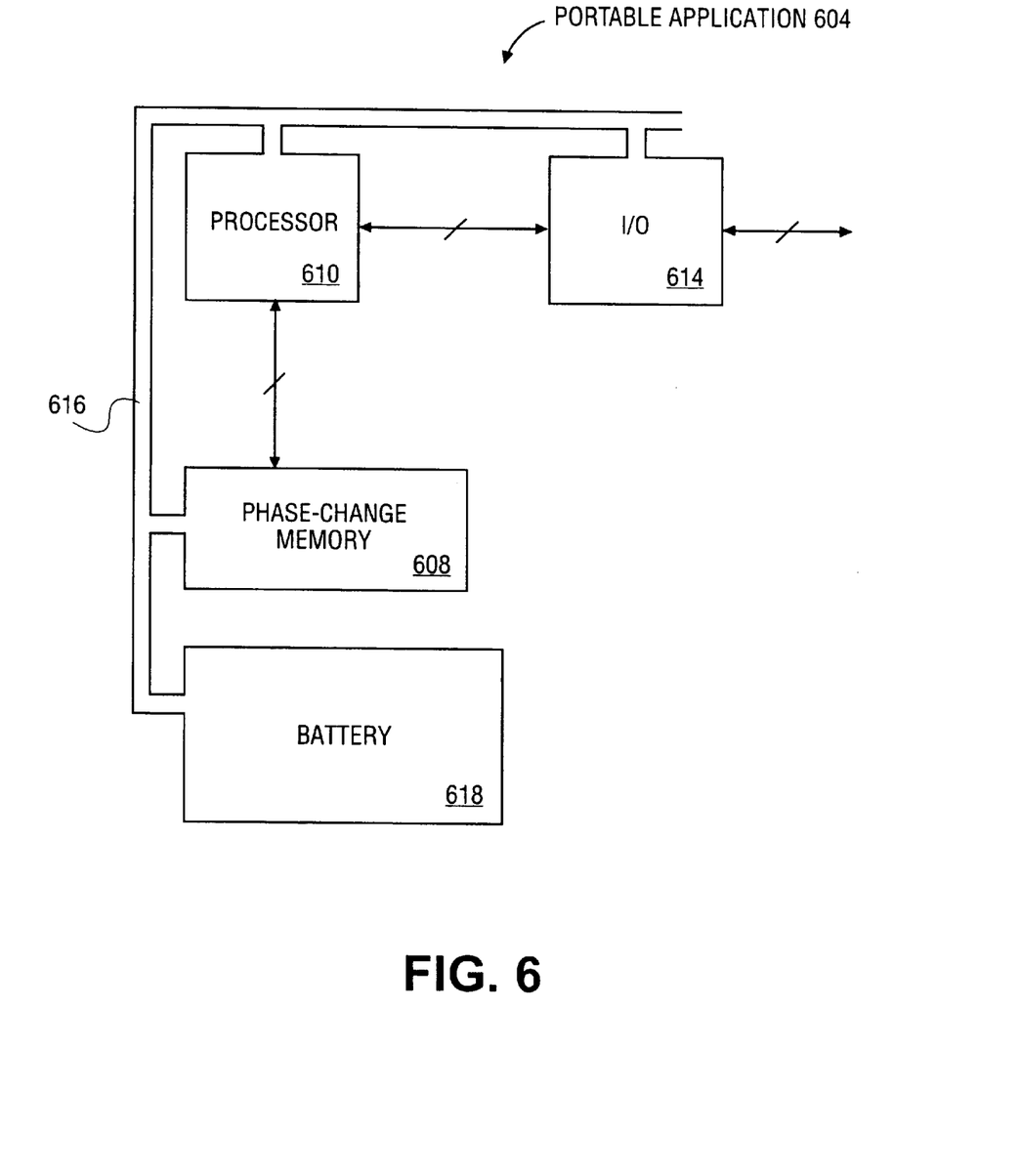
FIG. 6 shows a block diagram of a portable electronic device that embodies a phase-change memory IC having the capability of performing a read operation according to an embodiment of the invention.

Turning now to FIG. 6, what is shown is a block diagram of a portable electronic application 604 that embodies a phase-change memory storage subsystem 608 having the capability of performing a read operation as has been described above. The storage system 608 may be operated according to an embodiment of the read process described above. The storage system 608 may include one or more integrated circuit dies, where each die has a memory array that is programmed and read according to the embodiments described above in FIGS. 1–5. These IC dies may be separate, stand alone memory devices that are arranged in modules such as conventional dynamic random access memory (DRAM) modules, or they may be integrated with other on-chip functionalities such as part of an I/O processor or a microcontroller.

The application 604 may be for instance a portable notebook computer, a digital still and/or video camera, a personal digital assistant, or a mobile (cellular) hand-held telephone unit. In all of these applications, a processor 610 and the storage system 608 used as program memory to store code and data for execution by the processor have been operatively installed on the board. The portable application 604 communicates with other devices, such as a personal computer or a network of computers, via an I/O interface 614. This I/O interface 614 may provide access to a computer peripheral bus, a high speed digital communication transmission line, or an antenna for unguided transmissions. Communications between the processor and the storage system 608 and between the processor and the I/O interface 614 may be accomplished using conventional computer bus architectures.

The above-described components of the portable application 604 are powered by a battery 618 via a power supply bus 616. Since the application 604 is normally battery powered, its functional components including the storage system 608 should be designed to provide the desired performance at low power consumption levels. In addition, due to the restricted size of portable applications, the components shown in FIG. 6 should provide a relatively high density of functionality. Of course, there are non-portable applications for the storage system 608 that are not shown. These include, for instance, large network servers or other computing devices which may benefit from a non-volatile memory device such as the phase-change memory.

To summarize, various embodiments of a method and apparatus for reading a structural phase-change memory have been described. In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An integrated circuit comprising:
   means for storing information in a programmable manner by a structural phase change material;
   means for accessing the storage means;
   means for precharging the access means without changing the information stored by the storage means so that the access means is charged from a quiescent voltage level to a level below a programming threshold;
   means for causing a read current in the storage means; and
   means for timing the precharge means and the read current causing means so that the access means is charged immediately prior to the read current being caused.

2. The integrated circuit of claim 1 wherein the quiescent level is essentially at zero volts.

3. The integrated circuit of claim 1 further comprising:
   means for comparing a signal level caused by the read current on said access means to a reference level.

4. The integrated circuit of claim 3 wherein the signal level is a single-ended voltage with respect to a power supply return node voltage.

5. A method, comprising:
   applying a precharge signal to a bitline coupled to a phase-change memory cell prior to reading of the phase-change memory cell, wherein the level of the precharge signal is less than a programming threshold level of the phase-change memory cell; and
   while applying the precharge signal, isolating an input terminal of a sense amplifier from the bitline for a predetermined time interval.

6. The method of claim 5, wherein applying includes applying the precharge signal to raise a voltage on the bitline and wherein the precharge signal does not raise the phase-change memory cell voltage or the phase-change memory cell current to their programming threshold levels to prevent the phase-change memory cell from changing memory states.

7. The method of claim 6, further including:
   raising the cell current to a read level below the programming threshold level and comparing a bitline voltage, while the current is at the read level, to a reference voltage; and
   coupling the input terminal of the sense amplilfer to the bitline voltage while the current is at the read level, wherein the comparison of the bitline voltage to the reference voltage is performed by the sense amplifier whose output bit value represents a result of the comparison.

8. The method of claim 5, further comprising:
   programming the phase-change memory cell prior to applying the precharge signal to the phase-change memory cell;
   raising the phase-change memory cell current to a read level below the programming threshold level after applying the precharge signal to the phase-change memory cell; and
   comparing a voltage on the bitline coupled to the phase-change memory cell while the phase-change memory cell current is at the read level, to a reference voltage.

9. The method of claim 8, wherein programming includes:
   raising a voltage across the phase-change memory cell to a programming threshold level; and
   raising a current through the phase-change memory cell to programming threshold level.

10. The method of claim 5, wherein applying a precharge signal includes applying a precharge pulse voltage of about 1.5 volts or less on the bitline coupled to the phase-change memory cell.

11. The method of claim 5, further comprising applying a programming signal to the phase-change memory cell and wherein reading of the phase-change memory cell occurs prior to providing another programming signal to the phase-change memory cell.

12. An article comprising a storage medium having stored thereon instructions, that, when executed by a computing platform, result in:
   applying a precharge signal to a bitline coupled to a phase-change memory cell prior to reading of the phase-change memory cell, wherein the level of the precharge signal is less than a programming threshold level of the phase-change memory cell; and
   while applying the precharge signal, isolating an input terminal of a sense amplifier from the bitline for a predetermined time interval.

13. The article of claim 12, wherein the instructions, when executed, further result in:
   programming the phase-change memory cell prior to applying the precharge signal to the phase-change memory cell;
   raising the phase-change memory cell current to a read level below the programming threshold level after applying the precharge signal to the phase-change memory cell; and
   comparing a voltage on the bitline coupled to the phase-change memory cell while the phase-change memory cell current is at the read level, to a reference voltage.

14. The article of claim 12, wherein applying includes applying the precharge signal to raise a voltage on the bitline and wherein the precharge signal does not raise the phase-change memory cell voltage or the phase-change memory cell current to their programming threshold levels to prevent the phase-change memory cell from changing memory states.

15. An apparatus, comprising:
   a circuit to apply a precharge signal to a bitline coupled to a phase-change material prior to reading of the phase-change material, wherein the level of the precharge signal is less than a programming threshold level of the phase-change material; and
   a sense amplifier having an input adapted to be selectively isolated from the bitline for a predetermined time interval while applying the precharge signal.

16. The apparatus of claim 15, further comprising an isolation device coupled to the phase-change material.

17. The apparatus of claim 16, further comprising a current limiting device coupled between the phase-change material and the isolation device.

18. The apparatus of claim 15, wherein the phase-change material is a chalcogenide material and wherein the sense amplifier includes a transistor to isolate the input from the bitline.

19. An apparatus, comprising:
   a phase-change material;
   a heating element coupled to the phase-change material; and
   a circuit to apply a precharge signal to phase-change material prior to reading of the phase-change material, wherein the level of the precharge signal is less than a programming threshold level of the phase-change material.

20. The apparatus of claim 19, further comprising an isolation device coupled to the heating element.

21. The apparatus of claim 19, further comprising a read circuit to determine the memory state of the memory material.

22. The apparatus of claim 21, wherein the read circuit is a sense amplifier having an input adapted to be selectively isolated from the bitline for a predetermined time interval while applying the precharge signal, wherein the input of the sense amplifier is selectively isolated using a isolation device.

23. A system, comprising:
   a processor;
   an antenna coupled to the processor;
   a phase-change memory cell coupled to the processor, the phase-change memory cell comprising:
      a phase-change material;
      a heating element coupled to the phase-change material; and
      a circuit to apply a precharge signal to phase-change material prior to reading of the phase-change material, wherein the level of the precharge signal is less than a programming threshold level of the phase-change material.

24. The system of claim 23, further comprising an I/O interface coupled between the antenna and the processor.

25. The system of claim 23, wherein the system is a portable device.

26. The system of claim 25, wherein the portable device is a notebook computer, a digital camera, a video camera, a personal digital assistant, or a mobile telephone.

* * * * *